(12) United States Patent
Henige et al.

(10) Patent No.: US 8,032,811 B2
(45) Date of Patent: Oct. 4, 2011

(54) EFFICIENT ALMOST REGULAR PERMUTATION (ARP) INTERLEAVER AND METHOD

(75) Inventors: Thomas M. Henige, Dallas, TX (US); Eran Pisek, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 1245 days.

(21) Appl. No.: 11/715,202

(22) Filed: Mar. 7, 2007

(65) Prior Publication Data

US 2008/0115032 A1    May 15, 2008

Related U.S. Application Data

(60) Provisional application No. 60/858,237, filed on Nov. 9, 2006.

(51) Int. Cl.
*H03M 13/03* (2006.01)
(52) U.S. Cl. .......................... 714/755; 714/786; 714/752
(58) Field of Classification Search .................. 714/755, 714/786, 701, 752, 781
See application file for complete search history.

(56) References Cited

U.S. PATENT DOCUMENTS

| | | | |
|---|---|---|---|
| 2007/0109953 A1* | 5/2007 | Blankenship et al. | 370/203 |
| 2008/0091986 A1* | 4/2008 | Nimbalker et al. | 714/701 |
| 2010/0023844 A1* | 1/2010 | Kang et al. | 714/786 |

* cited by examiner

*Primary Examiner* — Fritz Alphonse

(57) ABSTRACT

An almost regular permutation (ARP) interleaver and method generate interleaved indices in a sequential fashion based on a process in which each interleaved index is a function of an adjacent index. Based on the data block size (N) for a received data block and a constant (C) for the ARP interleaver, a plurality of interleaved indices is generated. For one embodiment in which the interleaved indices are generated in forward sequence, the adjacent interleaved index is the immediately previous index, $P(j-1)$, and each interleaved index ($P(j)$) is generated based on incrementing the previous interleaved index ($P(j-1)$) by an incremental value $k(i)$, where j represents a non-interleaved index between 0 and $N-1$, i represents a modulo-C counter index that corresponds to j, $k(i)$ represents the i-th value of a set of incremental values associated with N and C.

29 Claims, 10 Drawing Sheets

EFFICIENT ALMOST REGULAR PERMUTATION (ARP) INTERLEAVER AND METHOD

CROSS-REFERENCE TO RELATED APPLICATION AND CLAIM OF PRIORITY

This application is related to U.S. Provisional Patent No. 60/858,237, filed Nov. 9, 2006, titled "Efficient Implementation of an ARP Interleaver." Provisional Patent No. 60/858,237 is assigned to the assignee of this application and is incorporated by reference as if fully set forth herein. This application claims priority under 35 U.S.C. §119(e) to Provisional Patent No. 60/858,237.

This application is related to U.S. patent application Ser. No. 11/123,313, now U.S. Pat. No. 7,668,992 filed on May 6, 2005, titled "Context-based Operation Reconfigurable Instruction Set Processor and Method of Operation" and to U.S. patent application Ser. No. 11/501,335 now U.S. Pat. No. 7,669,105, filed Aug. 9, 2006, titled "Generic Maximum A-posteriori Probability Decoder For Use In Software-Defined Radio Systems." application Ser. Nos. 11/123,313 and 11/501,335 are assigned to the assignee of this application and are incorporated by reference into this application as if fully set forth herein.

TECHNICAL FIELD OF THE INVENTION

The present application relates generally to wireless communication systems and, more specifically, to an efficient almost regular permutation (ARP) interleaver and method.

BACKGROUND OF THE INVENTION

All wireless communication standards involve the encoding and decoding of data. The purpose of encoding is to reduce the impact of noise on the transmitted data so that fewer errors appear in the received data. One typical part of the encoding process is interleaving of the data. Interleaving involves rearranging the sequence of data bits in a known pattern which has a low degree of correlation to the original, non-interleaved data. Both the interleaved and non-interleaved data are then further encoded and transmitted. Because of the low correlation between the interleaved and non-interleaved data, a disruption in one of the two messages will not similarly affect the other message.

One type of interleaver is known as the ARP interleaver. Interleavers of this type are specified for the Convolutional Turbo Coding (CTC) interleaver for the IEEE802.16 standard ("WiMax") and for the TTAS.KO-06.0064 standard ("WiBro"). ARP interleavers are also under consideration for other standards under development. Each standard provides a specific ARP algorithm that produces an interleaved index based on the block size of the original message and a non-interleaved index. Through repetitive application of this algorithm, a complete table or sequence of interleaved indices may be generated for any block size supported by the standard. These indices are then used to rearrange, or interleave, the data message.

A primary problem in interleaver design is the generation of the interleaved indices for the many operating conditions that are allowed by the standards. Conventional ARP interleavers typically generate these indices using one of two approaches: a look-up table (LUT) approach or an interleaver machine approach.

Using the LUT approach, the ARP interleaver includes a complete, pre-calculated table (or tables) of interleaved indices that is stored in a memory. However, this approach consumes a large amount of memory as the memory is generally large enough to hold a complete table of indices for the largest expected data block size. In addition, a separate table of indices must be maintained in memory or calculated for each possible data block size. If tables for all block sizes are maintained in memory, then the size and cost of the memory increase substantially. However, if only one table is maintained in memory, then a new table must be calculated for each possible block size and loaded into memory, substantially degrading system performance.

The interleaver machine approach provides hardware or software to calculate indices as requested for a given block size and original index, thereby solving the memory problem of the LUT approach. However, this approach requires the use of multiplication, addition/subtraction, division, modulo and comparison operations, which are relatively large and expensive to implement in hardware and which require many calculation cycles when implemented in software. Therefore, there is a need in the art for a more efficient ARP interleaver.

SUMMARY OF THE INVENTION

A method for operating an ARP interleaver is provided. According to an advantageous embodiment, the method includes generating each of a plurality of interleaved indices, $P(j)$, as a function of an adjacent interleaved index. For one embodiment, the adjacent interleaved index is the immediately previous index, $P(j-1)$, and each of the interleaved indices, $P(j)$, is generated based on the following formula: $P(j)=[P(j-1)+P_0+d(j)-d(j-1)]\mod N$, where N comprises a data block size, $P_0$ comprises a constant that is dependent on N, and $d(j)$ comprises a dither vector.

According to another embodiment of the present disclosure, a method for operating an ARP interleaver is provided that includes providing a first term based on a non-interleaved index value, j, and based on a data block size, N, for a current cycle. An interleaved index value for an adjacent cycle, $P(j-1)$, is provided as a second term for the current cycle. An interleaved index value for the current cycle, $P(j)$, is generated based on the first term for the current cycle and the second term for the current cycle.

According to yet another embodiment of the present disclosure, an efficient ARP interleaver is provided that includes a first term provider, a second term provider, a summation block, and an adjustment block. The first term provider is operable to provide a first term based on a non-interleaved index value, j, and based on a data block size, N, for a current cycle. The second term provider is operable to provide as a second term for the current cycle an interleaved index value for an adjacent cycle, $P(j-1)$. The summation block is coupled to the first term provider and the second term provider. The summation block is operable to receive the first term and the second term and to generate a summation block output for the current cycle by adding the first term and the second term. The adjustment block is coupled to the summation block. The adjustment block is operable to receive the summation block output and to generate an interleaved index value for the current cycle, $P(j)$, based on the summation block output.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

In one embodiment of the disclosure, the reconfigurable MAP and turbo decoders described herein may be implemented using a context-based operation reconfigurable instruction set processor (CRISP) device. CRISP devices are described in detail in U.S. patent application Ser. No. 11/123, 313, which was incorporated by reference above.

The present disclosure introduces a novel method of implementing an efficient almost regular permutation (ARP) interleaver that involves generating and using interleaved indices in a sequential fashion based on a recursive method in which each index is a function of an adjacent index. Although the unique ARP interleaver is implemented in a turbo decoder in the embodiments described herein, this is by way of illustration only and should not be construed so as to limit the scope of the present disclosure. Those skilled in the art will appreciate that the ARP interleaver disclosed herein may easily be adapted for use in other types of block decoders, as well as encoders.

Figure 1:
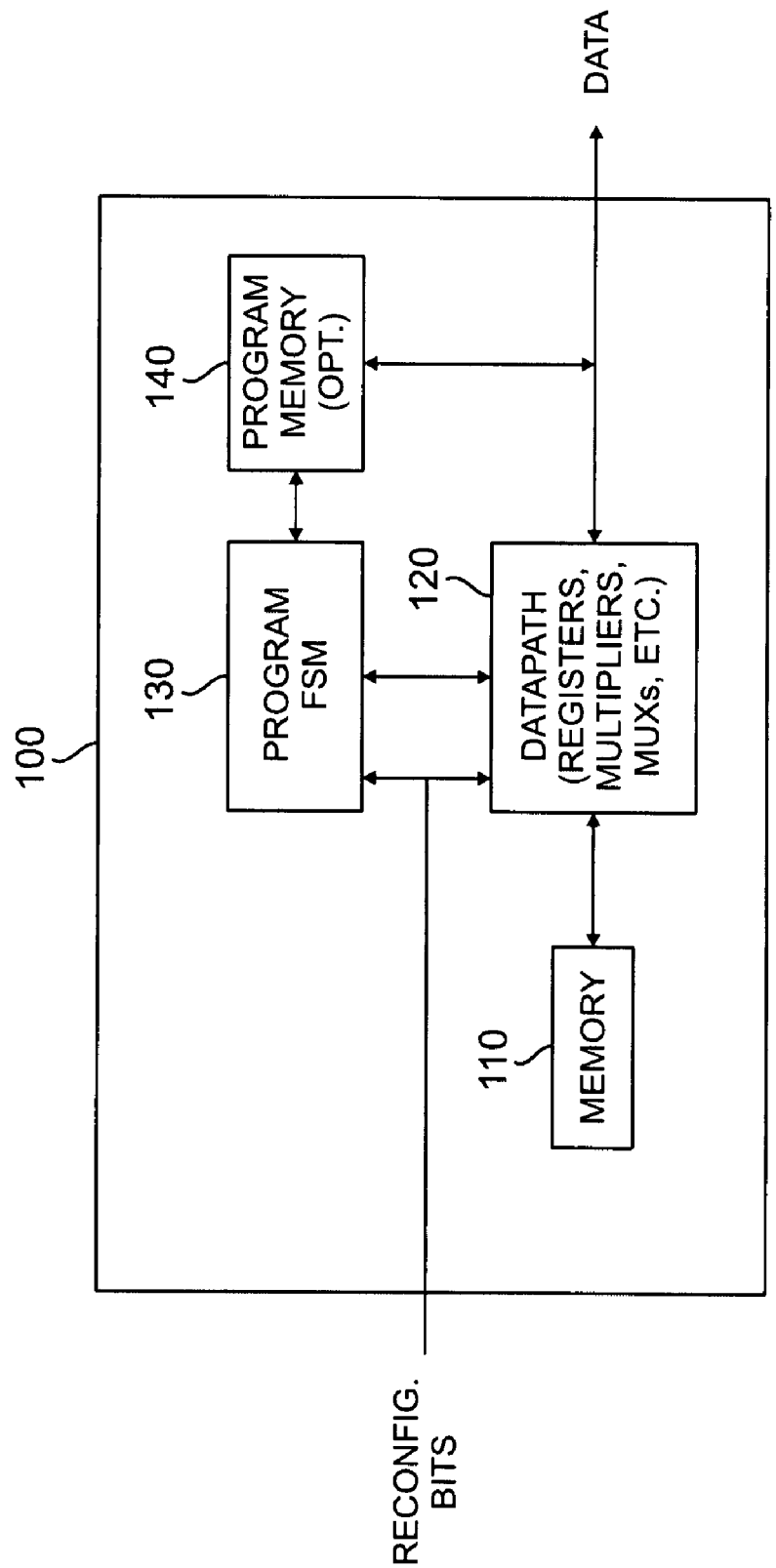
FIG. 1 is a high-level block diagram of a context-based operation reconfigurable instruction set processor (CRISP) that may be used to implement an efficient almost regular permutation (ARP) interleaver according to the principles of the disclosure.

FIG. 1 is a high-level block diagram of CRISP 100, which may be used to implement an efficient almost regular permutation (ARP) interleaver according to the principles of the present disclosure. CRISP 100 comprises memory 110, programmable data path circuitry 120, programmable finite state machine 130, and optional program memory 140. A context is a group of instructions of a data processor that are related to a particular function or application, such as turbo decoding instructions. As described in U.S. patent application Ser. No. 11/123,313, CRISP 100 implements only a subset of context-related instructions in an optimum manner.

CRISP 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing turbo decoding in CRISP 100, the disclosed turbo decoder reduces the problems related to flexibility and power consumption that affect conventional turbo decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a turbo decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
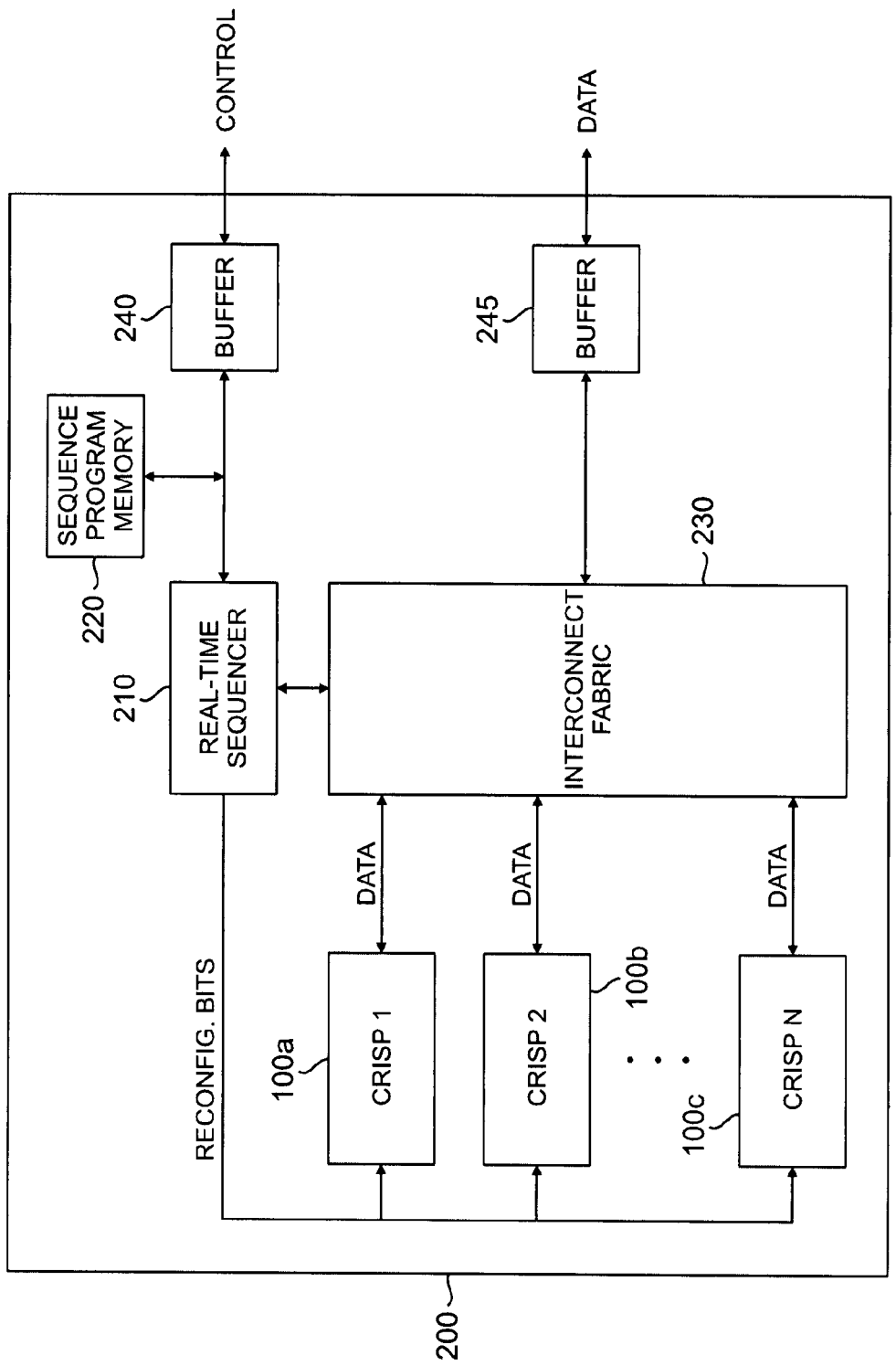
FIG. 2 is a high-level block diagram of a reconfigurable processing system according to the principles of the disclosure.

FIG. 2 is a high-level block diagram of reconfigurable processing system 200 according to one embodiment of the present disclosure. Reconfigurable processing system 200 comprises N CRISPs, such as CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In one embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In one embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In one embodiment, reconfigurable processing system 200 may be a cell phone or a similar wireless device or may be a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a turbo decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
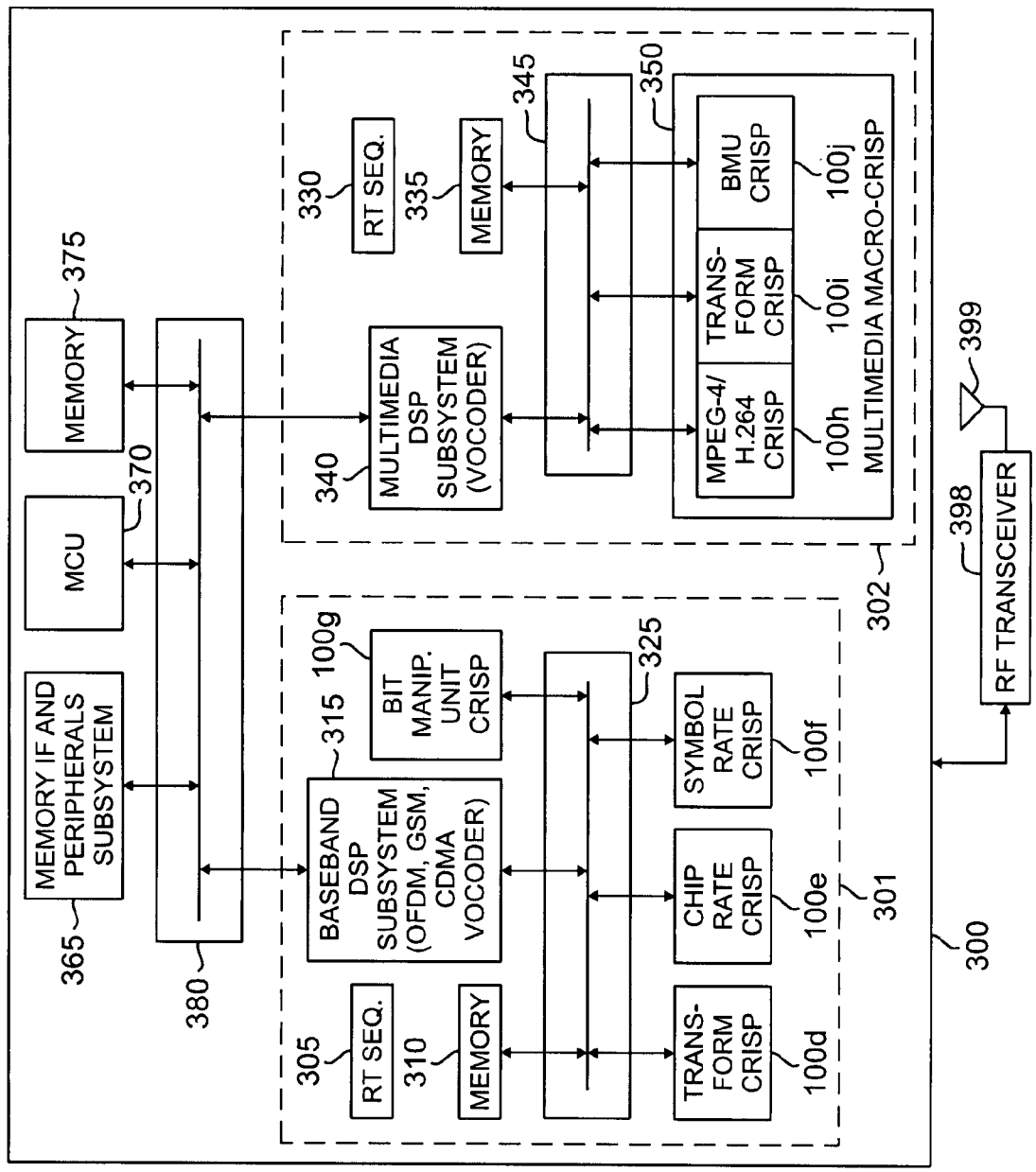
FIG. 3 is a high-level block diagram of a multi-standard software-defined radio (SDR) system that implements a reconfigurable MAP decoder that may include an efficient ARP interleaver according to the principles of the disclosure.

FIG. 3 is a high-level block diagram of multi-standard SDR system 300, which implements a reconfigurable MAP decoder that may include an efficient ARP interleaver according to the principles of the disclosure. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose CRISPs, including transform CRISP 10d, chip rate CRISP 10e, symbol rate CRISP 10f, and bit manipulation unit (BMU) CRISP 10g. By way of example, transform CRISP 100d may implement a Fast Fourier Transform (FFT) function, chip rate CRISP 10e may implement a correlation function for a CDMA signal, and symbol rate CRISP 10f may implement a turbo decoder function or a Viterbi decoder function.

In such an embodiment, transform CRISP 10d may receive samples of an intermediate frequency (IF) signal stored in memory 375 and perform an FFT function that generates a sequence of chip samples at a baseband rate. Next, chip rate CRISP 10e receives the chip samples from transform CRISP 10d and performs a correlation function that generates a sequence of data symbols. Next, symbol rate CRISP 100f receives the symbol data from chip rate CRISP 10e and performs turbo decoding or Viterbi decoding to recover the baseband user data. The baseband user data may then be used by applications subsystem 302.

In one embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose CRISPs, including MPEG-4/H.264 CRISP 100h, transform CRISP 100i, and BMU CRISP 100j. In one embodiment of the disclosure, MPEG-4/H.264 CRISP 100h performs motion estimation functions and transform CRISP 100i performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4:
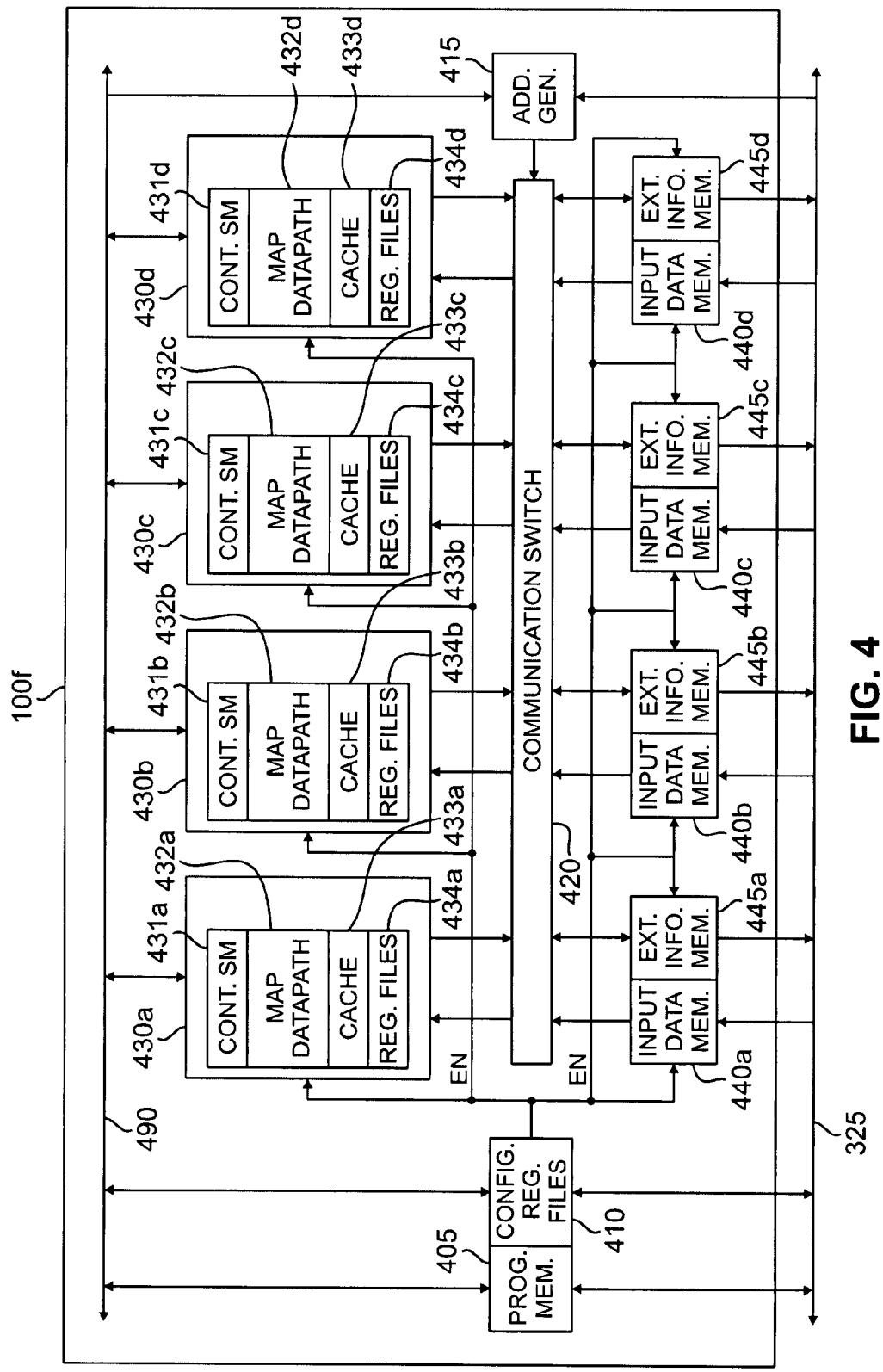
FIG. 4 is a block diagram of a reconfigurable turbo decoder implemented in a CRISP according to the principles of the disclosure according to the principles of the disclosure.

FIG. 4 is a block diagram of a reconfigurable turbo decoder implemented in CRISP 100f according to the principles of the disclosure. Turbo decoder CRISP 100f comprises program memory 405, configuration register files 410, address generator 415, communication switch 420, processing units 430a-430d, input data memories 440a-440d, extrinsic information memories 445a-445d, and internal bus 490. Each one of processing units 430a-430d comprises a control state machine (SM), a MAP datapath, a cache, and control register files. By way of example, processing unit 430a comprises control state machine 431a, MAP datapath 432a, cache 433a, and control register files 434a. Although four processing units 430 are illustrated in FIG. 4, this is by way of example only. Other embodiments of turbo decoder CRISP 100f may implement less than four processing units 430 or more than four processing units 430.

A conventional MAP turbo decoder architecture generally comprises two primary functional blocks: i) soft-input, soft-output (SISO) stages that implement an a-posteriori probability (APP) algorithm; and ii) an interleaver/de-interleaver that scrambles the data according to the interleaving rules followed by the encoder in the transmitting device. Other blocks are required for the implementation of the decoder, such as a RAM (random-access memory) for storing data from each iteration of the decoder. Turbo decoder CRISP 100f includes all the building blocks of a conventional MAP turbo decoder. In one embodiment, each one of MAP datapaths 432a-432d implements a sliding window MAP algorithm. However, alternate embodiments of turbo decoder CRISP 100f may implement non-sliding window MAP algorithms.

In turbo decoder CRISP 100f, MAP datapaths 432a, 432b, 432c and 432d temporarily store the values of $\alpha$ (alpha), $\beta$ (beta), and $\lambda$ (lambda) in caches 433a, 433b, 433c, and 433d. The extrinsic information (i.e., the $\lambda$ values) from each iteration for each decoding block is stored in extrinsic information memories 445a, 445b, 445c and 445d via communication switch 420. In one embodiment, MCU 370 loads a configuration program and configuration data into turbo decoder CRISP 100f via an external system bus (i.e., interconnect 325). The configuration program is stored in program memory 405. MCU 370 loads the configuration data into configuration register files 410 and control register files 434a-434d in order to initialize the register files. Configuration register files 410 and control register files 434a-434d are used to control which processing units 430a-430d, input data memories 440a-440d, and extrinsic information memories 445a-445d are used in an application. Configuration register files 410 provide enable (EN) signals to control processing units 430, input data memories 440, and extrinsic information memories 445. Turbo decoder CRISP 100f reads input data samples and writes decoded output data via the system bus (i.e., interconnect 325).

In order to achieve high decoding rates, turbo decoder CRISP 100f implements N parallel processing units 430a-430d. In this example, N=4. Processing units 430a-430d are independent and essentially identical to each other. Each one of processing units 430a-430d is capable of connecting to each one of input data memories 440a-440d and extrinsic information memories 445a-445d via communication switch 420. For higher data rate standards, all of processing units 430a-430d may operate simultaneously and in parallel. For lower data rate standards, one or more of processing units 430a-430d may be set to a sleep mode (i.e., deactivated or disabled) in order to reduce power consumption.

As noted above, each one of processing units 430a-430d comprises control state machine 431, MAP datapath 432, cache 433 and control register files 434. In one embodiment of turbo decoder CRISP 100f, each processing unit 430 processes two soft input data samples at a time. The two soft input data samples correspond to two data symbols. In one embodiment, each soft input data sample may comprise 8 bits. MAP datapath 432 performs both forward and backward recursions over the trellis. During the forward recursion and optionally also during the backward recursion, both the input symbol and the extrinsic ($\lambda$) information must be accessed to compute the branch metric, $\gamma$ (gamma). In order to reduce memory access power consumption, the $\gamma$ value may be computed and stored in cache 433 in each processing unit 430. If the values of $\alpha$, $\beta$, and $\lambda$ are not calculated simultaneously, the $\alpha$ value may also be stored in cache 433 to reduce data movement and power consumption.

MAP datapath 432 may compute the $\alpha$, $\beta$, and $\lambda$ values in parallel or in consecutive (or sequential) order. Parallel execution is faster but requires more die space and power consumption. Consecutive processing incurs longer delays but requires less die space and less power consumption. In one embodiment, each one of MAP datapaths 432a-432d computes the $\alpha$, $\beta$, and $\lambda$ values sequentially. Control state machine 431 decodes instructions from program memory received via internal bus 490 and controls the overall operation and configuration of processing unit 430. Since turbo decoder CRISP 100f may compute large instruction loops, control state machine 431 may use a hardware loop to reduce overhead and power consumption.

There are eight memory blocks in turbo decoder CRISP 100f: four input data memories 440a that hold the input data (or symbol) samples and four extrinsic information memories 445 that hold the extrinsic information (i.e., $\lambda$ values) generated in each half iteration of the turbo decoder. The eight memory blocks are divided into four groups. Each memory group includes one input data memory 440 and one extrinsic information memory 445. By way of example, input data memory 440a and extrinsic information memory 445a form a first memory group, input data memory 440b and extrinsic information memory 445b form a second memory group, and so forth.

Each one of processing units 430a-430d reads and writes to one memory group at a time. Each one of processing units 430a-430d is capable of writing to each one of the memory groups. Thus, none of the memory groups is dedicated to a specific processing unit 430. For example, processing unit 430a may be connected by communication switch 420 to a first memory group (e.g., memories 440a and 445a) during one memory cycle and may read from or write to another memory group (e.g., memories 440c and 445c) during another memory cycle.

Communication switch 420 dynamically controls the connections between processing units 430a-430d and the memory groups comprised of memories 440a-440d and memories 445a-445d. The connection order or pattern is determined by the operation of address generator 415. Thus, communication switch 420 performs the interleaver and de-interleaver operations for a MAP decoder. As described in more detail below in connection with FIG. 8, for one embodiment of the disclosure, address generator 415 may be implemented by a small memory and/or a small logic function. For this embodiment, the external control DSP/MCU, such as MCU 370, may pre-compute offline a plurality of parameters to be used for interleaving and write the parameters to the small memory of address generator 415 during an initialization phase. For another embodiment, instead of storing the parameters, address generator 415 may be designed to generate the parameters using a small amount of logic. In addition, address generator 415 may be designed to generate the interleaver pattern based on the parameters using only a small amount of logic. According to the principles of the disclosure, MAP datapaths 432a-d are reconfigurable devices that may be modified to operate in turbo decoders or other types of decoders and may be modified to operate under different RF protocols. Thus, MAP datapaths 432a-d provide a generic architecture to support not only α (alpha), β (beta), λ (lambda), and γ (gamma) calculations but also different communication systems that use MAP decoders.

Figure 5:
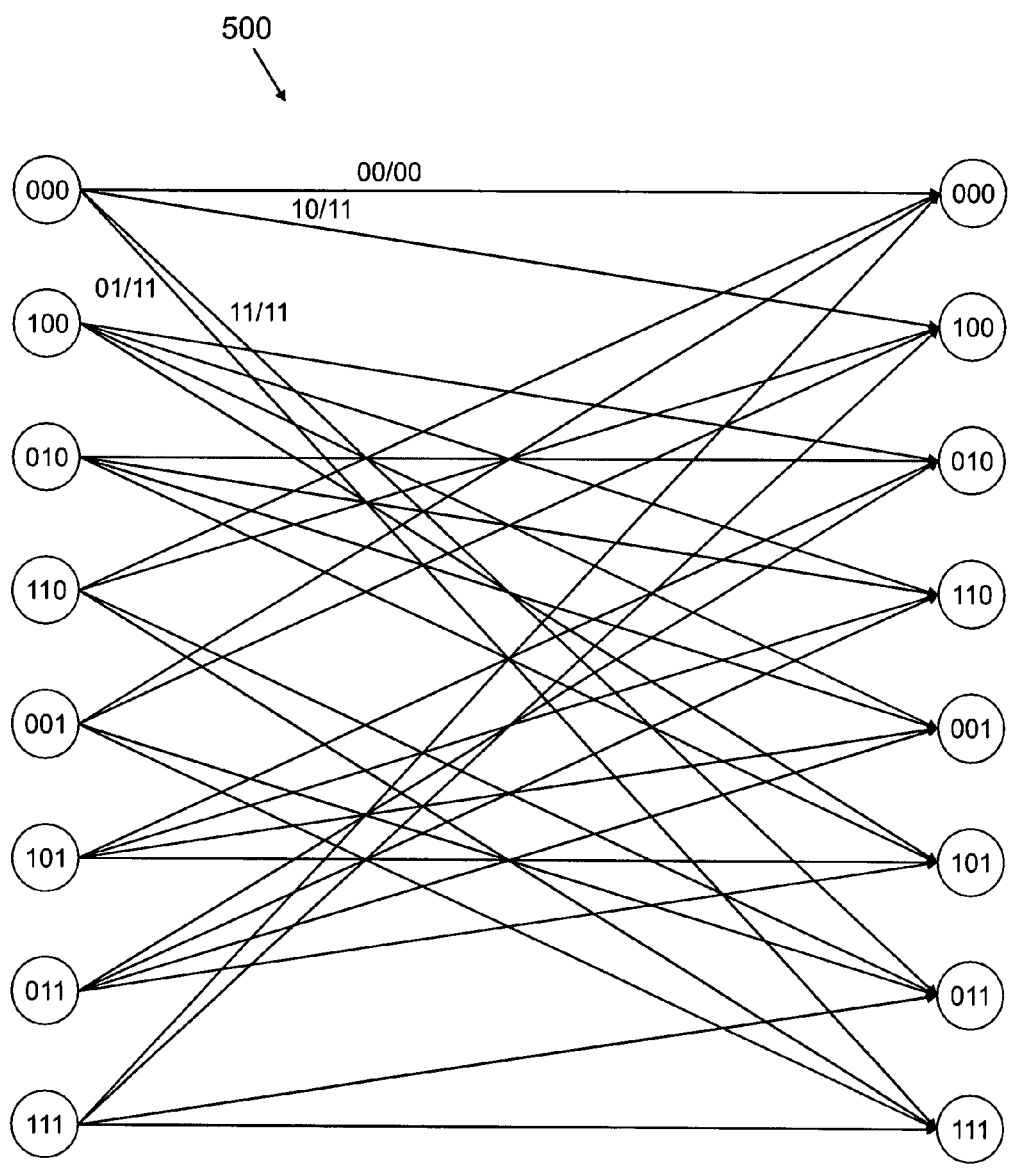
FIG. 5 is an example of a trellis diagram for a WiBro wireless network.

A MAP algorithm may be represented by a trellis. Different communication systems, such as WCDMA, WiBro, and the like, use different trellises. FIG. 5 illustrates an example of a trellis 500 for a WiBro wireless network that may be implemented by reconfigurable MAP datapaths 432a-d. Inside trellis 500 in FIG. 5, alpha, beta and lambda are calculated in either the forward direction or the backward direction. It is noted that there are eight states in trellis 500 and that there are four paths leading from a state at time t to a state at time t+1. This means there are 32 possible paths between states in trellis 500.

As is well known, a conventional turbo encoder uses two constituent encoders. A first encoder receives an original bit stream and generates a first parity bit stream. A second encoder receives an interleaved copy of the original bit stream and generates a second parity bit stream. The data transmitted by the turbo encoder comprises the original bit stream, the first parity bits from the first encoder, and the second parity bits from the second encoder.

Figure 6A:
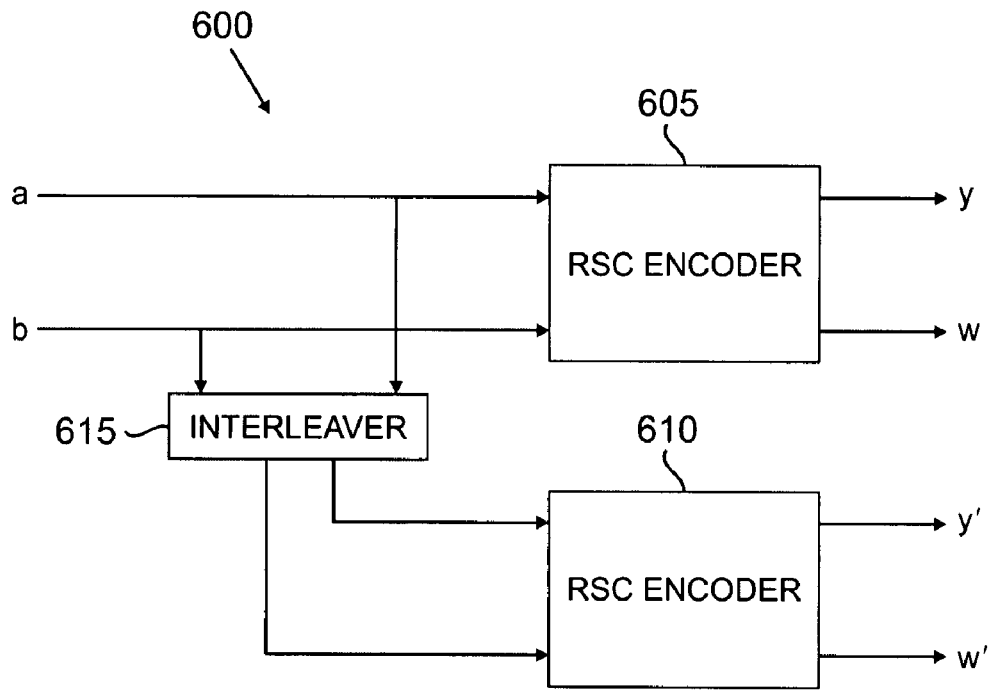
FIG. 6A is a high-level block diagram illustrating a duo-binary encoder including an efficient ARP interleaver according to one embodiment of the disclosure.

FIG. 6A is a high-level block diagram illustrating duo-binary encoder 600 according to one embodiment of the present disclosure. Duo-binary encoder 600 comprises recursive systematic code (RSC) encoders 605 and 610 and ARP interleaver 615. In a duo-binary encoder (e.g., WiBro mode), a first sequence of the inputs a and b is applied to RSC encoder 605 and a second, interleaved sequence of the inputs a and b is applied to RSC encoder 610. The first encoder (RSC encoder 605) outputs the first parity bit stream (y, w), and the second encoder (RSC encoder 610) outputs the second parity bit stream (y', w').

Figure 6B:
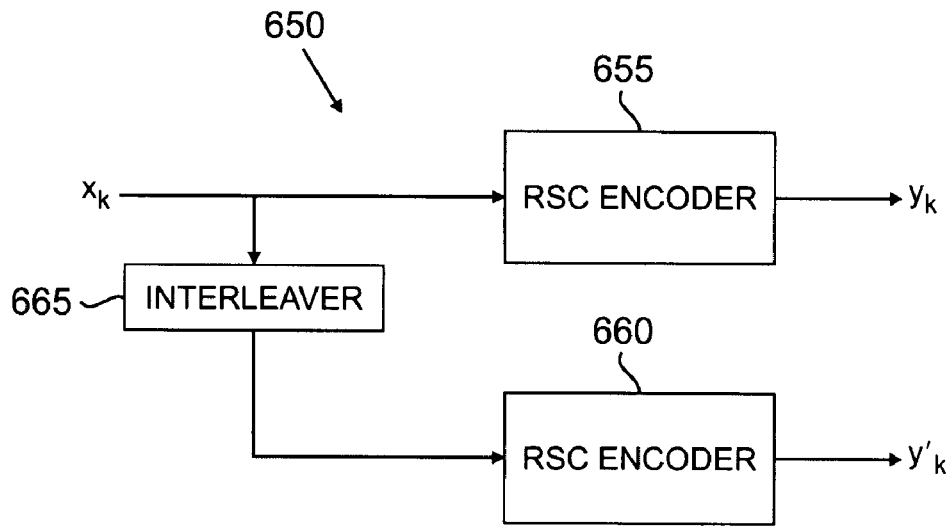
FIG. 6B is a high-level block diagram illustrating a binary encoder including an efficient ARP interleaver according to one embodiment of the disclosure.

FIG. 6B is a high-level block diagram illustrating binary encoder 650 according to one embodiment of the present disclosure. Binary encoder 650 comprises RSC encoders 655 and 660 and ARP interleaver 665. In a binary turbo encoder (e.g., WCDMA mode), a first sequence of inputs $x_k$ is applied to RSC encoder 655 and a second, interleaved sequence of the inputs $x_k$ is applied to RSC encoder 660. The first encoder (RSC encoder 655) outputs the first parity bit stream $y_k$ and the second encoder (RSC encoder 660) outputs the second parity bit stream $y'_k$.

Figure 7:
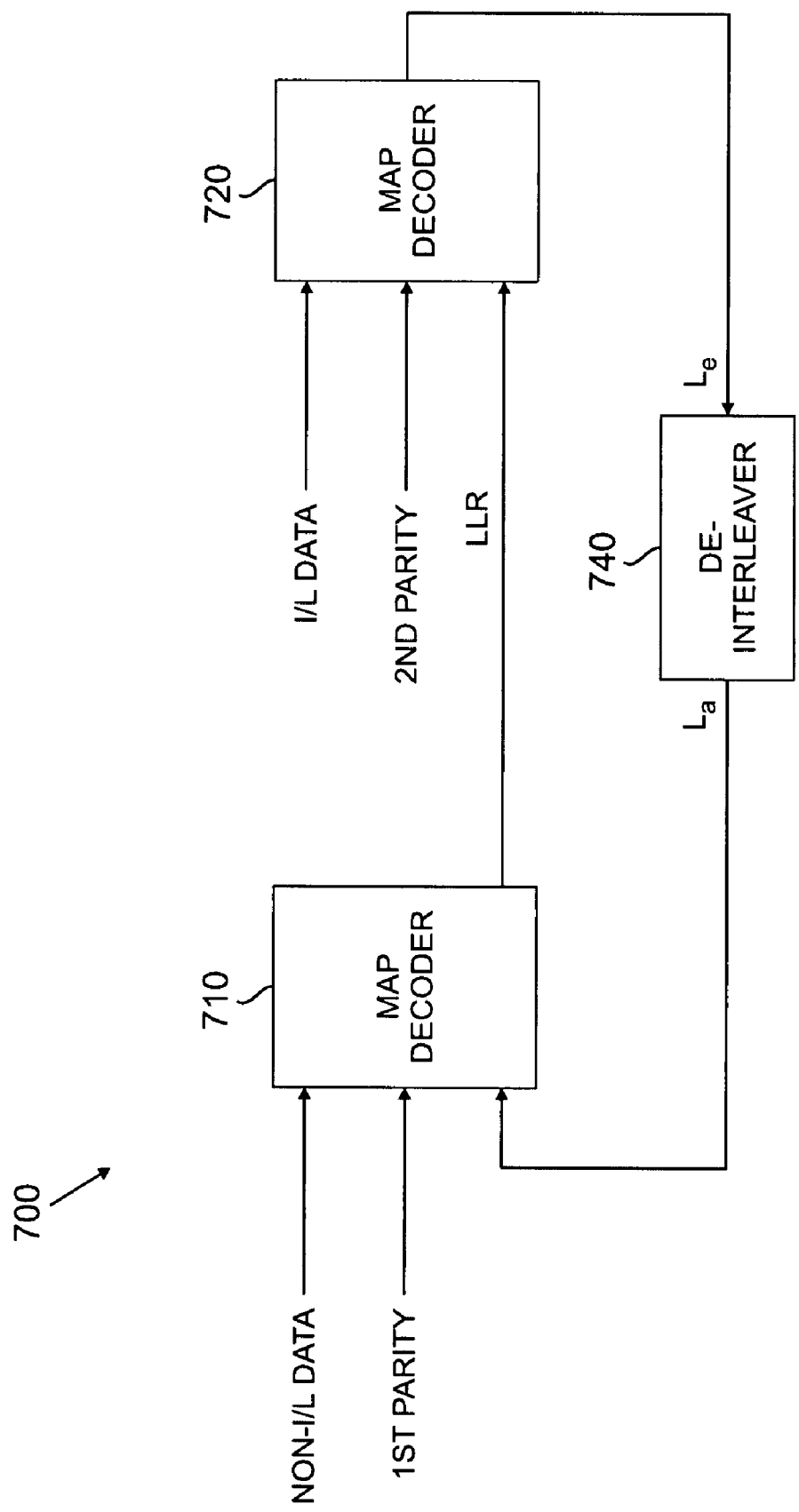
FIG. 7 is a high-level block diagram illustrating a turbo decoder including an efficient ARP interleaver according to one embodiment of the disclosure.

FIG. 7 is a high-level block diagram illustrating turbo decoder 700 according to one embodiment of the present disclosure. Each one of processing units 430a-430d implements a turbo decoder similar to turbo decoder 700. Turbo decoder 700 comprises MAP decoder block 710, MAP decoder block 720, and de-interleaver block 740.

MAP decoders 710 and 720 operate in man iterative manner. MAP decoder 720 generates a new sequence of soft decision outputs that are fed back to MAP decoder 710 via de-interleaver block 740. De-interleaver block 740 is operable to generate interleaved indices for de-interleaving the soft decision outputs from MAP decoder 720 based on the algorithm described below in connection with FIGS. 8 and 9. This process may be repeated several times to increase the reliability of the decoded sequence.

MAP decoder block 710 receives data samples (soft values) from the demodulator corresponding to the non-interleaved (non-I/L) original data bits (e.g., (a,b) or $x_k$ from FIGS. 6A and 6B), the first parity bits (e.g., (y,w) or $y_k$ from FIGS. 6A and 6B) processed by the first encoder (605 or 655) in the transmitter, and the input $L_a$, which is the extrinsic (λ) information from MAP decoder 720. MAP decoder block 710 uses the original data bits and the first parity bits to estimate the probability, or log likelihood ratio (LLR), that the value of each original data bit is a Logic 1 or a Logic 0. MAP decoder block 720 receives data samples (soft values) from the demodulator corresponding to the interleaved (I/L) original data bits (e.g., interleaved (a,b) or interleaved $x_k$ from FIGS. 6A and 6B), the second parity bits (e.g., (y',w') or $y'_k$ from FIGS. 6A and 6B) processed by the second encoder (610 or 660), and the probability estimates (LLR) from MAP decoder block 710.

The process of decoding by MAP decoder blocks 710 and 720 comprises one iteration of turbo decoder 700. Turbo decoder 700 may perform a fixed number of iterations or half iterations or may perform iterations until some external mechanism determines that additional iterations will not improve the bit error rate (BER) for a particular data frame. A hard decision is then made on the last soft outputs to determine the original data bits.

As is well known, a MAP algorithm is a trellis decoding algorithm, similar to the Viterbi algorithm. The MAP algorithm within the two decoder blocks 710 and 720 operates on soft inputs (i.e., the demodulator outputs and the probability estimates) and produces soft outputs. The following description summarizes the MAP algorithm computations performed by one iteration of one decoder block. It should be noted that the example of the turbo decoder processes two input symbols at a time. In the case of duo-binary code (e.g., WiBro mode), the two input symbols to turbo decoder 700 are a, b, y, w, y' and w' from a single time sample. In the case of binary code (e.g., WCDMA mode), the inputs to the turbo decoder are $x_1$, $y_1$, and $y'_1$ from a first time sample and $x_2$, $y_2$, and $y'_2$ from a second time sample. Processing two input symbols at a time requires a radix-4 trellis mechanism, as shown in FIG. 5.

Figure 8:
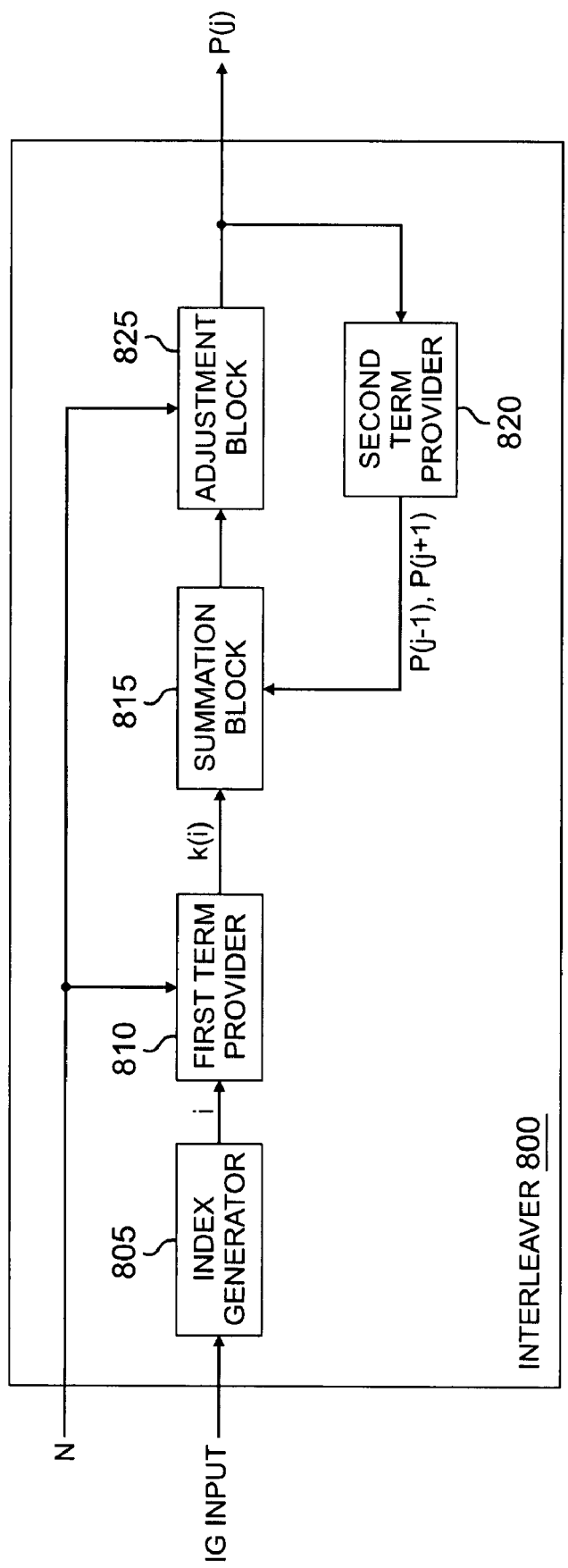
FIG. 8 is a high-level block diagram illustrating details of the ARP interleaver of FIG. 6A, 6B or 7 according to one embodiment of the disclosure.

FIG. 8 is a high-level block diagram illustrating details of an ARP interleaver 800, which may be implemented as interleaver 615 or 655 or as part of de-interleaver 740, according to one embodiment of the disclosure. It will be understood that ARP interleaver 800 may be implemented in any other suitable encoder or decoder. For one embodiment, ARP interleaver 800 is a CTC ARP interleaver. Also, as described in more detail below, ARP interleaver 800 comprises an index generator 805, a first term provider 810, a summation block 815, a second term provider 820 and an adjustment block 825.

ARP interleaver 800 is defined by the following equation:

$$P(j) = (P_0 \cdot j + d(j)) \bmod N, \tag{Eq. 1}$$

where N is the block size, j is the non-interleaved index that ranges from 0 to N−1, $P_0$ is a constant that depends on N, P(j) is the interleaved index, and d(j) is the dither vector. The dither vector, d(j), is a function of j and a constant C, which may be different for different block sizes. The dither vector may be defined as follows:

$$d(j) = f(j \bmod C) \tag{Eq. 2}$$

A conventional interleaver machine approach to implementing the above interleaver algorithm involves looking up the appropriate value for $P_0$, calculating the value of d(j), and then performing multiplication, addition and modulo functions to calculate P(j). This approach is relatively large and expensive to implement in hardware and generally requires many calculation cycles when implemented in software. Thus, in order to simplify these operations, interleaver 800 is operable to generate and use the indices in a sequential fashion, as described below.

For one embodiment, interleaver 800 is operable to generate the indices based on a recursive method in which each index is a function of the previous index as follows:

$$P(j)=f(P(j-1)).$$

One way of creating such a function is to use an increment value that represents the difference between P(j) and P(j−1), such as an increment value defined as follows:

$$P(j)-P(j-1)=(P_0 \cdot j+d(j)) \bmod N - (P_0 \cdot (j-1)+d(j-1)) \bmod N. \quad \text{(Eq. 3)}$$

Modular arithmetic has the following property:
  Given: $A_1 \equiv B_1 \bmod N$ and $A_2 \equiv B_2 \bmod N$
  Then: $(A_2-A_1) \equiv (B_2-B_1) \bmod N$
Using this property, Equation 3 may be simplified as follows:

$$P(j)=[P(j-1)+P_0+d(j)-d(j-1)] \bmod N. \quad \text{(Eq. 4)}$$

As seen in Equation 2 above, d(j) is a function of j mod C. Therefore, d(j) may have only C different values for a given block size. It also follows that d(j)−d(j−1) may also have only C different values. These values may be pre-calculated and stored in a table, or the values may be generated with a logical function. Furthermore, the $P_0$ term may be combined with these values to form a single table of length C, which may be stored in a memory or generated with a logical function. This table (or function) may be called k, where k(j) is the value of k for index j. Equation 4 may then be rewritten as follows:

$$P(j)=[P(j-1)+k(j \bmod C)] \bmod N. \quad \text{(Eq. 5)}$$

The term of j mod C does not require division by C. In addition, since j is incremented sequentially, interleaver 800 may implement this term as a modulo-C counter for efficiency.

Since the final result for P(j) will be a modulo-N number, the modulo-N operation may be applied to the values of k without affecting the resulting values of P(j). This ensures that the following is true:

$$k(i)<N, \text{ where } i=j \bmod C.$$

Using this observation, together with a constraint that the interleaved indices are generated in sequential order, results in the following:

```
if (P(j − 1) + k(i) < N) then
    P(j) = P(j − 1) + k(i)
else
    P(j) = P(j − 1) + k(i) − N.
```

Therefore, in order to calculate P(j), interleaver 800 need not perform a division by N to obtain the modulus of Equation 5. Instead, interleaver 800 may use a comparison and a conditional subtraction of N. In either a hardware or software implementation, this is much more efficient than performing division by N.

For one embodiment of a CTC interleaver 800, given a block size of N couples, the sequence of interleaved indices P(j) for j=0, 1, 2, ... N−1 may be generated as follows:

| Switch j mod 4: | |
|---|---|
| Case 0: | $P(j) = (P_0 \cdot j + 1) \bmod N$ |
| Case 1: | $P(j) = (P_0 \cdot j + 1 + N/2 + P_1) \bmod N$ |
| Case 2: | $P(j) = (P_0 \cdot j + 1 + P_2) \bmod N$ |
| Case 3: | $P(j) = (P_0 \cdot j + 1 + N/2 + P_3) \bmod N$ |

The values $P_0$, $P_1$, $P_2$, and $P_3$ are constants that depend solely on the block size N. These values are provided in a table in the IEEE802.16 standard. Using the previously described methods, this may be reworked into the form of Equation 5:

$$P(j)=[P(j-1)+k(j \bmod C)] \bmod N,$$

where $N \in \{24,36,48,72,96,108,120,144,180,192,216,240\}$ and C=4.

Using this example, the following equations provide the k values for the table:

$$k(0)=P_0+N/2+P$$

$$k(1)=P_0+P_2-N/2-P_1$$

$$k(2)=P_0+N/2+P_3-P_2$$

$$k(3)=P_0-N/2-P_3.$$

Thus, for one example, the values of k for each valid block size may be as shown in the table below:

| Block Size (N) | k(0) | k(1) | k(2) | k(3) |
|---|---|---|---|---|
| 24 | 17 | 17 | 17 | 17 |
| 36 | 11 | 11 | 11 | 11 |
| 48 | 13 | 13 | 13 | 13 |
| 72 | 53 | 41 | 53 | 41 |
| 96 | 7 | 31 | 7 | 79 |
| 108 | 11 | 67 | 11 | 63 |
| 120 | 13 | 13 | 13 | 13 |
| 144 | 19 | 87 | 19 | 87 |
| 180 | 11 | 11 | 11 | 11 |
| 192 | 11 | 59 | 11 | 155 |
| 216 | 13 | 13 | 13 | 13 |
| 240 | 13 | 73 | 13 | 193 |

To generate k, this table may be stored in a small look-up table memory of interleaver 800. Using the example of the table above, the look-up table memory may comprise a size of 384 bits. However, it will be understood that the look-up table memory may comprise any suitable size. For example, if the fact that k(0) and k(2) are always the same and/or the fact that some rows comprise only one value are exploited, the look-up table may comprise less than 384 bits. In addition, the look-up table memory may comprise various sizes for other embodiments, such as embodiments using different numbers of possible data block sizes, different values of C, different dither vectors, different values of $P_0$, different k(j) vectors and/or any other suitable variations.

For another method of generating k values, a logic function may be implemented that generates one of the k values for any given value of N and j mod C. For a particular embodiment of this logic function implemented in hardware, only about 60 two-input gates are needed. Using either the small look-up table or the logic function to generate k values results in an interleaver 800 that is far more compact than an interleaver that uses a memory to hold one complete table of P(j) indices, which would require 1920 bits for the above example, or that uses a memory containing indices for all 12 values of N, which would require 11,808 bits for the above example.

For each data block, interleaver 800 is operable to receive as inputs a data block size of N and, for each cycle, an index generator (IG) input. Interleaver 800 is also operable to generate as an output, for each cycle, an interleaved index value of P(j) based on those inputs. It will be understood that interleaver 800 may be operable to receive additional inputs, such as the table described above for an embodiment in which first term provider 810 is operable to store the table, the value of C and/or any other suitable inputs.

Index generator 805 is operable to receive the index generator input, and first term provider 810 and adjustment block 825 are each operable to receive the input N. Based on the index generator input, index generator 805 is operable to generate an index generator output, i, between 0 and C−1. For example, for one embodiment, the non-interleaved index value of j may be provided to interleaver 800 as the index generator input. For this embodiment, index generator 805 is operable to modify the input j by the Modulo-C operation to generate the output i. For another embodiment, an enable or increment signal may be provided to interleaver 800 as the index generator input. For this embodiment, index generator 805 may comprise a Modulo-C counter that is operable to generate the output i by applying the Modulo-C operation to a value that is incremented with each cycle based on the enable or increment signal.

First term provider 810 is coupled to index generator 805 and is operable to receive the index generator output and, based on that index generator output, to provide a first term, k(i), for summing by summation block 815. First term provider 810 may comprise a first term table or a first term generator. For the embodiment in which first term provider 810 comprises a first term table, the table may comprise a size of (C+1)×(X+1), where X is the number of different data block sizes that are possible. For the embodiment in which first term provider 810 comprises a first term generator, the generator may comprise a logic function capable of generating k for any given value of N and j mod C. For example, for one embodiment, the generator may comprise no more than 60 two-input gates.

Summation block 815 is coupled to first term provider 810 and to second term provider 820 and is operable to receive the first term generated by first term provider 810, along with a second term, P(j−1), generated by second term provider 820, and to sum the first term and the second term to generate a summation block output.

Adjustment block 825 is coupled to summation block 815 and is operable to receive the summation block output and to adjust the summation block output, if necessary, to a value less than N, in generating the interleaved index value, P(j). For example, adjustment block 825 may comprise a Modulo-N operation such that, if the summation block output is less than N, adjustment block 825 outputs the unadjusted summation block output as P(j). However, if the summation block output is greater than N, adjustment block 825 subtracts N from the summation block output and outputs the result as P(j).

Second term provider 820 is coupled to adjustment block 825 and is operable to receive the output, P(j), of adjustment block 825 and to store the output for use in the following cycle of interleaver 800. Thus, second term provider 820 is operable to provide to summation block 815 the value of P(j) from the previous cycle (i.e., P(j−1)) as the second term for use in calculating the next P(j).

For another embodiment in which interleaver 800 is operated in a reverse direction as opposed to the forward direction described above, interleaver 800 is operable to generate the indices based on a recursive method in which each index is a function of the subsequent index as follows:

$$P(j)=f(P(j+1)).$$

For this embodiment, the interleaved indices are generated based on the following:

--- if (P(j + 1) − k(i) ≧ 0) then
    P(j) = P(j + 1) − k(i)
else
    P(j) = P(j + 1) − k(i) + N.

---

For this reverse embodiment, the index generator input may comprise the non-interleaved index value of i, as described above, or may comprise an enable or decrement signal. First term provider 810 is operable to receive the index generator output and, based on that index generator output, to provide a first term, k(i), for summation block 815. Summation block 815 is operable to receive the first term generated by first term provider 810, along with a second term, P(j+1), generated by second term provider 820, and to subtract the first term from the second term to generate a summation block output. Alternatively, first term provider may provide as a first term −k(i), and summation block 815 may add the first term to the second term to generate the summation block output.

Adjustment block 825 is operable to receive the summation block output and to adjust the summation block output, if necessary, to a value greater than 0, in generating the interleaved index value, P(j). For example, adjustment block 825 may comprise a Modulo-N operation such that, if the summation is greater than or equal to 0, adjustment block 825 outputs the unadjusted summation block output as P(j). However, if the summation block output is less than 0, adjustment block 825 adds N to the summation block output and outputs the result as P(j).

Second term provider 820 is operable to receive the output, P(j), of adjustment block 825 and to store the output for use in the following cycle of interleaver 800. Thus, because interleaver 800 is operating in a reverse direction for this embodiment, second term provider 820 is operable to provide to summation block 815 the value of P(j) from the subsequent cycle (i.e., P(j+1)) as the second term for use in calculating the next P(j).

Figure 9:
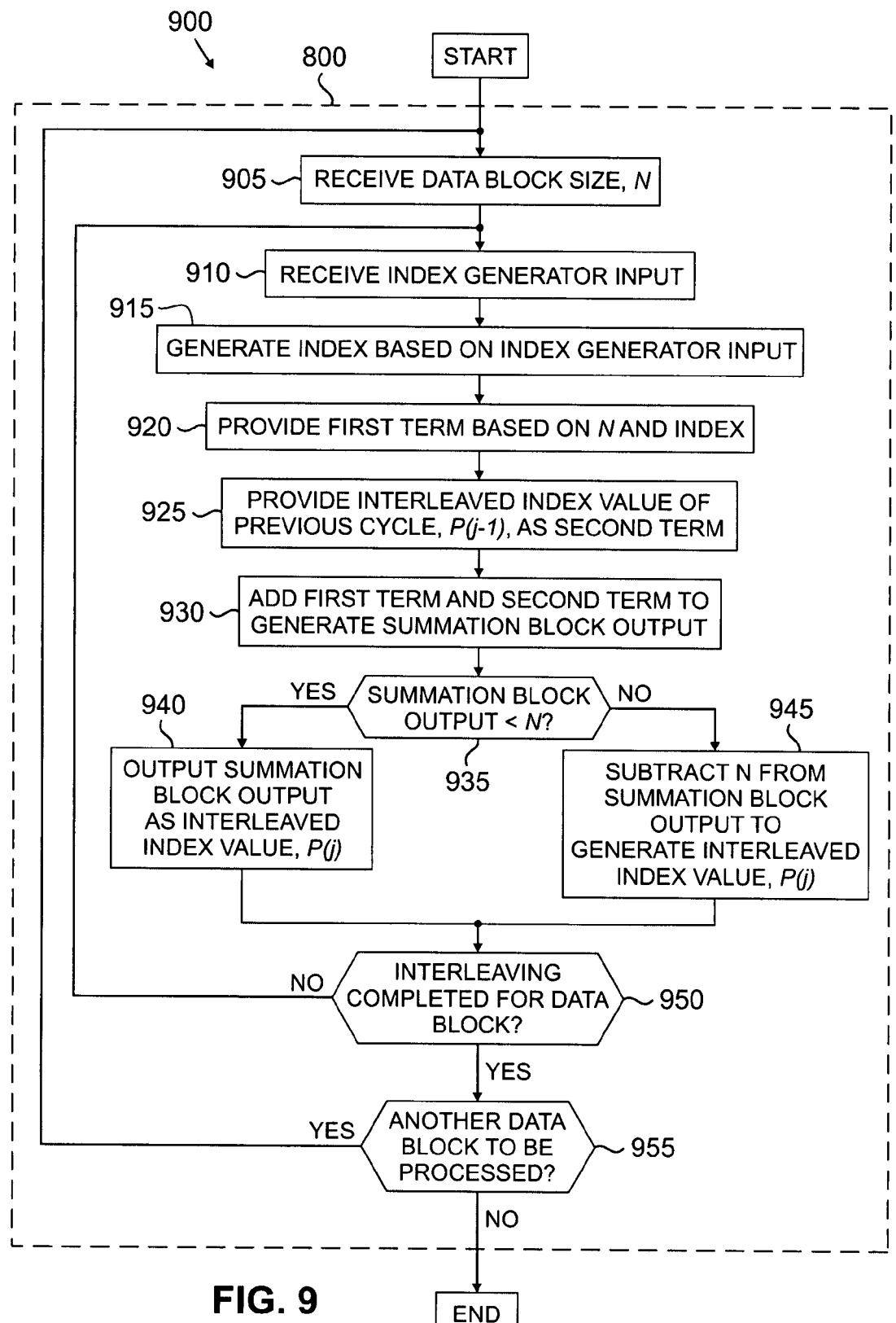
FIG. 9 is a flow diagram illustrating a method for operating the ARP interleaver of FIG. 8 in a forward direction according to one embodiment of the disclosure.

FIG. 9 is a flow diagram illustrating a method 900 for operating the ARP interleaver 800 in a forward direction according to one embodiment of the disclosure. Although described as discrete steps performed in a particular order, it will be understood that the steps of this method 900 may be performed by the various components of interleaver 800 based on signals received at each of the components when those signals are received.

Initially, interleaver 800 receives a data block size, N (process step 905). For one embodiment, first term provider 810 and adjustment block 825 each receive the input N. Interleaver 800 also receives a non-interleaved index value, j (process step 910). For one embodiment, index generator 805 receives the non-interleaved index value, j, as the index generator input. For another embodiment, index generator 805 receives an enable signal or an increment signal as the index generator input.

Index generator 805 generates an index, i, based on the index generator input (process step 915). For one embodiment, index generator 805 performs a Modulo-C operation or comprises a Modulo-C counter that repeatedly cycles through the index generator outputs of 0 to C−1 with each cycle. First term provider 810 provides a first term to summation block 815 based on the index and the input N (process step 920). For example, for one embodiment, first term provider 810 provides the first term based on a first term table. For this embodiment, the data block size, N, may correspond to a row identifier and the index, i, may correspond to a column identifier or vice versa. For another embodiment, first term provider 810 provides the first term based on a first term generator.

Second term provider 820 provides as a second term to summation block 815 an interleaved index value from the immediately previous cycle (i.e., P(j−1)) (process step 925). For an initial cycle, second term provider 820 may provide a predetermined second term to summation block 815.

Summation block 815 adds the first term and the second term (process step 930). Adjustment block 825 determines whether the summation block output generated by summation block 815 is less than the block size, N (process step 935). If the summation block output is less than the block size, N (process step 935), adjustment block 825 outputs the summation block output as an interleaved index value, P(j), for the current cycle (process step 940). However, if the summation block output is greater than or equal to the block size, N (process step 935), adjustment block 825 generates the interleaved index value, P(j), for the current cycle by subtracting N from the summation block output (process step 945).

After the interleaved index value, P(j), is generated by adjustment block 825 (process steps 940 and 945), interleaver 800 determines whether the interleaving process has been completed for the data block (process step 950). If the interleaving process has not been completed for the data block (process step 950), interleaver 800 receives a subsequent index generator input (process step 905), and the method continues as before.

However, if the interleaving process has been completed for the data block (process step 950), interleaver 800 determines whether another data block is ready to be processed (process step 955). If there is another data block ready to be processed (process step 955), interleaver 800 may receive the same or a different data block size, N (process step 905), and the method continues as before. However, if there are no more data blocks to be processed (process step 955), the method comes to an end.

Figure 10:
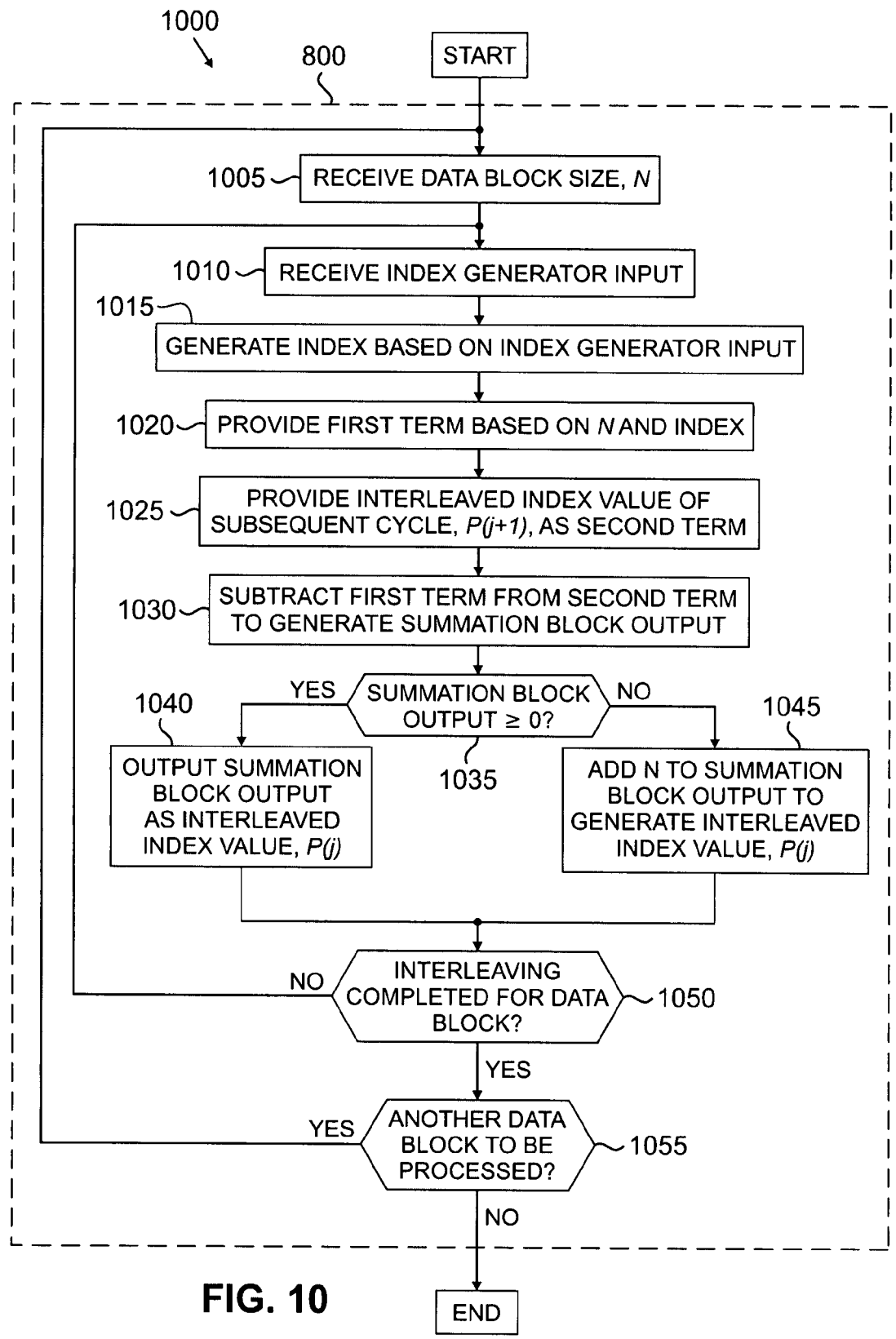
FIG. 10 is a flow diagram illustrating a method for operating the ARP interleaver of FIG. 8 in a reverse direction according to one embodiment of the disclosure.

FIG. 10 is a flow diagram illustrating a method 1000 for operating the ARP interleaver 800 in a reverse direction according to one embodiment of the disclosure. Although described as discrete steps performed in a particular order, it will be understood that the steps of this method 1000 may be performed by the various components of interleaver 800 based on signals received at each of the components when those signals are received.

Initially, interleaver 800 receives a data block size, N (process step 1005). For one embodiment, first term provider 810 and adjustment block 825 each receive the input N. Interleaver 800 also receives an index generator input (process step 1010). For one embodiment, index generator 805 receives the non-interleaved index value, j, as the index generator input. For another embodiment, index generator 805 receives an enable signal or a decrement signal as the index generator input.

Index generator 805 generates an index, i, based on the index generator input (process step 1015). For one embodiment, index generator 805 performs a Modulo-C operation or comprises a Modulo-C counter that repeatedly cycles through the index generator outputs of 0 to C−1 with each cycle. First term provider 810 provides a first term to summation block 815 based on the index and the input N (process step 1020). For example, for one embodiment, first term provider 810 provides the first term based on a first term table. For this embodiment, the data block size, N, may correspond to a row identifier and the index, i, may correspond to a column identifier or vice versa. For another embodiment, first term provider 810 provides the first term based on a first term generator.

Second term provider 820 provides as a second term to summation block 815 an interleaved index value from the immediately subsequent cycle (i.e., P(j+1)) (process step 1025). For an initial cycle, second term provider 820 may provide a predetermined second term to summation block 815.

Summation block 815 subtracts the first term from the second term (process step 1030). Alternatively, first term provider 810 negates the first term, allowing summation block 815 to add the first and second terms. Adjustment block 825 determines whether the summation block output generated by summation block 815 is greater than or equal to 0 (process step 1035). If the summation block output is greater than or equal to 0 (process step 1035), adjustment block 825 outputs the summation block output as an interleaved index value, P(j), for the current cycle (process step 1040). However, if the summation block output is less than 0 (process step 1035), adjustment block 825 generates the interleaved index value, P(j), for the current cycle by adding the data block size, N, to the summation block output (process step 1045).

After the interleaved index value, P(j), is generated by adjustment block 825 (process steps 1040 and 1045), interleaver 800 determines whether the interleaving process has been completed for the data block (process step 1050). If the interleaving process has not been completed for the data block (process step 1050), interleaver 800 receives a subsequent index generator input (process step 1005), and the method continues as before.

However, if the interleaving process has been completed for the data block (process step 1050), interleaver 800 determines whether another data block is ready to be processed (process step 1055). If there is another data block ready to be processed (process step 1055), interleaver 800 may receive the same or a different data block size, N (process step 1005), and the method continues as before. However, if there are no more data blocks to be processed (process step 1055), the method comes to an end.

In this way, for the table embodiment of first term provider 810, interleaver 800 is flexible enough to function as essentially any kind of an ARP interleaver by merely changing C and the small table of first term provider 810 described above (as opposed to a full ARP interleaver table), without any change to the interleaver logic. In addition, interleaver 800 complies with both the WiBro and WiMax standards, along with a variety of other possible standards. Also, using these methods 900 and 1000, increment values may be generated for multiple block sizes and for either forward or reverse directions.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for operating an almost regular permutation (ARP) interleaver, comprising:
   determining a data block size, N, for a data block to be processed by the interleaver; and
   sequentially generating at the ARP interleaver a plurality of interleaved indices for the received data block, each interleaved index (P(j)) generated based on an adjacent interleaved index and an additive value determined based on j, j comprising a non-interleaved index that corresponds with a current cycle of the ARP interleaver and is based on N.

2. The method as set forth in claim 1, wherein P(j) is calculated based on the following equation:

$$P(j) = \begin{cases} P(j-1) + k(i) & \text{if } P(j-1) + k(i) < N \\ P(j-1) + k(i) - N & \text{if } P(j-1) + k(i) \geq N \end{cases}$$

when the interleaved indices are generated in forward sequence, P(j−1) comprising the adjacent interleaved index, i comprising a modulo-C counter index that corresponds to j, k(i) representing the additive value and comprising the i-th value of a set of incremental values associated with N and C, and C comprising a setting constant for the ARP interleaver that determines a number of values in the set of incremental values.

3. The method as set forth in claim 2, wherein k(i) is based on a dither vector comprising a function of j and C.

4. The method as set forth in claim 1, wherein P(j) is calculated based on the following equation:

$$P(j) = \begin{cases} P(j+1) - k(i) & \text{if } P(j+1) - k(i) \geq 0 \\ P(j+1) - k(i) + N & \text{if } P(j+1) - k(i) < 0 \end{cases}$$

when the interleaved indices are generated in reverse sequence, P(j+1) comprising the adjacent interleaved index, i comprising a modulo-C counter index that corresponds to j, k(i) representing the additive value and comprising the i-th value of a set of incremental values associated with N and C, and C comprising a setting constant for the ARP interleaver that determines a number of values in the set of incremental values.

5. The method as set forth in claim 4, further comprising calculating, for each of a plurality of possible data block sizes, C different values for k(i) based on a predetermined logic function.

6. The method as set forth in claim 4, further comprising storing a k(i) look-up table that corresponds to C in a memory, the k(i) look-up table comprising sets of k(i) values according to possible data block sizes, wherein incrementing the previous interleaved index (P(j−1)) by k(i) comprises looking up k(i) based on N and i.

7. The method as set forth in claim 4, wherein generating each P(j) comprises calculating k(i) based on a logical function associated with N and C.

8. A method for operating an almost regular permutation (ARP) interleaver, comprising:
providing a first term for a current cycle from a first term provider, the first term associated with a non-interleaved index value, j, that corresponds with the current cycle and is based on a data block size, N, for a data block to be processed by the interleaver;
providing a second term for the current cycle from a second term provider, the second term comprising an interleaved index value for an adjacent cycle; and
generating an interleaved index value for the current cycle, P(j), based on the first term for the current cycle and the second term for the current cycle.

9. The method as set forth in claim 8, further comprising:
calculating a plurality of k values based on a dither vector, d(j), and based on a parameter, $P_0$, wherein $P_0$ comprises a constant that is dependent on N,
wherein the plurality of k values comprises a set of C incremental values associated with N that are added to the second term to generate P(j), C comprising a setting constant for the ARP interleaver that determines a number of separate k values for a given N, and
wherein providing the first term comprises providing one of the k values that corresponds to a modulo-C counter index value for j.

10. The method as set forth in claim 9, further comprising storing the k values in a first term table.

11. The method as set forth in claim 9, providing one of the k values comprising generating the k value with a first term generator.

12. The method as set forth in claim 9, the dither vector defined as d(j)=f(j mod C), wherein C determines a number of values in the dither vector.

13. The method as set forth in claim 12, calculating the plurality of k values comprising calculating, for each of a plurality of possible data block sizes, C separate k values.

14. The method as set forth in claim 8, generating the interleaved index value for the current cycle, P(j), comprising:
generating a summation block output by adding the first term for the current cycle and the second term for the current cycle, wherein the second term comprises a previous interleaved index value, P(j−1);
comparing the summation block output to the data block size, N;
outputting the summation block output as the interleaved index value for the current cycle when the summation block output is less than the data block size, N; and
subtracting N from the summation block output to generate the interleaved index value for the current cycle when the summation block output is greater than or equal to the data block size, N.

15. The method as set forth in claim 8, generating the interleaved index value for the current cycle, P(j), comprising:
generating a summation block output by subtracting the first term for the current cycle from the second term for the current cycle, wherein the second term comprises a subsequent interleaved index value, P(j+1);
comparing the summation block output to zero;
outputting the summation block output as the interleaved index value for the current cycle when the summation block output is greater than or equal to zero; and
adding N to the summation block output to generate the interleaved index value for the current cycle when the summation block output is less than zero.

16. An efficient almost regular permutation (ARP) interleaver, comprising:
a first term provider configured to provide a first term for a current cycle based on a non-interleaved index value, j, that corresponds with the current cycle, and based on a data block size, N, for the data block to be processed by the interleaver;
a second term provider configured to provide as a second term for the current cycle an interleaved index value for an adjacent cycle;
a summation block coupled to the first term provider and the second term provider, the summation block configured to receive the first term and the second term and to generate a summation block output for the current cycle based on the first term and the second term; and
an adjustment block coupled to the summation block, the adjustment block configured to receive the summation block output and to generate an interleaved index value for the current cycle, P(j), based on the summation block output.

17. The ARP interleaver as set forth in claim 16, the first term provider comprising a first term table.

18. The ARP interleaver as set forth in claim 17, the first term table configured to store a plurality of k values calculated based on a dither vector, d(j), and based on a parameter, $P_0$, wherein $P_0$ comprises a constant that is dependent on N, the plurality of k values comprising a set of C incremental values associated with N that are used as the first term in the summation block to generate the summation output, and the first term provider configured to provide the first term by providing one of the stored k values that corresponds to a modulo-C counter index value for j, C comprising a setting constant for the ARP interleaver that determines a number of separate k values for a given N.

19. The ARP interleaver as set forth in claim 18, the dither vector defined as $d(j)=f(j \bmod C)$, wherein C determines a number of values in the dither vector.

20. The ARP interleaver as set forth in claim 19, the first term table configured to store, for each of a plurality of possible data block sizes, C separate k values.

21. The ARP interleaver as set forth in claim 16, the first term provider comprising a first term generator.

22. The ARP interleaver as set forth in claim 21, the first term generator comprising at most 60 two-input gates.

23. The ARP interleaver as set forth in claim 21, the first term generator configured to generate a plurality of k values calculated based on a dither vector, d(j), and based on a parameter, $P_0$, wherein $P_0$ comprises a constant that is dependent on N, the plurality of k values comprising a set of C incremental values associated with N that are used as the first term in the summation block to generate the summation output, and the first term provider configured to provide the first term by generating one of the k values that corresponds to a modulo-C counter index value for j, C comprising a setting constant for the ARP interleaver that determines a number of separate k values for a given N.

24. The ARP interleaver as set forth in claim 23, the dither vector defined as $d(j)=f(j \bmod C)$, wherein C determines a number of values in the dither vector.

25. The ARP interleaver as set forth in claim 24, the first term generator configured to generate, for each of a plurality of possible data block sizes, C separate k values.

26. The ARP interleaver as set forth in claim 16, further comprising a counter coupled to the first term provider, the counter configured to provide an index generator output to the first term provider based on the non-interleaved index value, j, for the current cycle, the first term provider configured to provide the first term based on the index generator output.

27. The ARP interleaver as set forth in claim 26, the counter comprising a Modulo-C counter configured to provide a corresponding modulo-C value based on j to as the index generator output to the first term provider, wherein C comprises a constant for the ARP interleaver that determines a number of possible first term values for a given N.

28. The ARP interleaver as set forth in claim 16,
the summation block configured to generate the summation block output for the current cycle by adding the first term and the second term, wherein the second term comprises a previous interleaved index value, P(j−1); and
the adjustment block configured to generate the interleaved index value for the current cycle, P(j), based on the summation block output by (i) comparing the summation block output to the data block size, N; (ii) outputting the summation block output as the interleaved index value for the current cycle when the summation block output is less than the data block size, N; and (iii) subtracting N from the summation block output to generate the interleaved index value for the current cycle when the summation block output is equal to or greater than the data block size, N.

29. The ARP interleaver as set forth in claim 16,
the summation block configured to generate the summation block output for the current cycle by subtracting the first term from the second term, wherein the second term comprises a subsequent interleaved index value, P(j+1); and
the adjustment block configured to generate the interleaved index value for the current cycle, P(j), based on the summation block output by (i) comparing the summation block output to zero; (ii) outputting the summation block output as the interleaved index value for the current cycle when the summation block output is greater than or equal to zero; and (iii) adding N to the summation block output to generate the interleaved index value for the current cycle when the summation block output is less than zero.

* * * * *